(12) United States Patent
Shin et al.

(10) Patent No.: US 10,153,163 B2
(45) Date of Patent: Dec. 11, 2018

(54) HARDMASK COMPOSITION AND METHOD OF FORMING PATTERNING BY USING THE HARDMASK COMPOSITION

(71) Applicant: Samsung Electronics Co., Ltd., Suwon-si, Gyeonggi-do (KR)

(72) Inventors: Hyeonjin Shin, Suwon-si (KR); Sangwon Kim, Seoul (KR); Seongjun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/611,935

(22) Filed: Jun. 2, 2017

(65) Prior Publication Data

US 2017/0271154 A1   Sep. 21, 2017

Related U.S. Application Data

(62) Division of application No. 14/697,150, filed on Apr. 27, 2015.

(30) Foreign Application Priority Data

Jul. 25, 2014   (KR) ........................ 10-2014-0095007

(51) Int. Cl.
*H01L 21/033* (2006.01)
*H01L 21/02* (2006.01)
(Continued)

(52) U.S. Cl.
CPC ............ *H01L 21/0332* (2013.01); *C08K 3/22* (2013.01); *C08K 3/30* (2013.01); *C08K 3/38* (2013.01);
(Continued)

(58) Field of Classification Search
CPC ......... H01L 21/31144; H01L 21/02282; H01L 21/0332; H01L 21/3081; H01L 21/3086
See application file for complete search history.

(56) References Cited

U.S. PATENT DOCUMENTS 4,550,015 A   10/1985   Korb et al.
4,679,054 A   7/1987   Yoshikawa et al.
(Continued)

FOREIGN PATENT DOCUMENTS

CN   102774824 A   11/2012
CN   102775786 A   11/2012
(Continued)

OTHER PUBLICATIONS

European Search Report dated Sep. 30, 2015 issued in European Application No. 15169702.6.
(Continued)

*Primary Examiner* — Jaehwan Oh
(74) *Attorney, Agent, or Firm* — Harness, Dickey & Pierce, P.L.C.

(57) ABSTRACT

Example embodiments relate to a hardmask composition and/or a method of forming a fine pattern by using the hardmask composition, wherein the hardmask composition includes at least one of a two-dimensional layered nanostructure and a precursor thereof, and a solvent, and an amount of the at least one of a two-dimensional layered nanostructure and the precursor is about 0.01 part to about 40 parts by weight based on 100 parts by weight of the hardmask composition.

8 Claims, 9 Drawing Sheets

(51) Int. Cl.
    *C08K 3/38* (2006.01)
    *C08K 3/30* (2006.01)
    *C08K 5/56* (2006.01)
    *C08K 3/22* (2006.01)
    *C09D 7/63* (2018.01)
    *C09D 7/61* (2018.01)
    *G03F 7/09* (2006.01)
    *H01L 21/311* (2006.01)

(52) U.S. Cl.
    CPC ............... *C08K 5/56* (2013.01); *C09D 7/61* (2018.01); *C09D 7/63* (2018.01); *G03F 7/094* (2013.01); *H01L 21/02112* (2013.01); *H01L 21/02282* (2013.01); *H01L 21/31122* (2013.01); *H01L 21/31144* (2013.01); *C08K 2003/2255* (2013.01); *C08K 2003/3009* (2013.01); *C08K 2003/385* (2013.01); *H01L 21/0254* (2013.01); *H01L 21/02565* (2013.01); *H01L 21/02568* (2013.01); *H01L 21/02584* (2013.01); *H01L 21/02628* (2013.01)

(56) References Cited

U.S. PATENT DOCUMENTS

| | | | |
|---|---|---|---|
| 5,432,227 A | 7/1995 | Fujimura | |
| 6,120,858 A | 9/2000 | Hirano et al. | |
| 7,658,969 B2 | 2/2010 | Kumar et al. | |
| 7,803,715 B1 | 9/2010 | Haimson et al. | |
| 8,008,095 B2 | 8/2011 | Assefa et al. | |
| 8,071,485 B2 | 12/2011 | Lee et al. | |
| 8,258,346 B2 | 9/2012 | Rajendran | |
| 8,524,594 B2 | 9/2013 | Horikoshi | |
| 8,664,439 B2 | 3/2014 | Lee et al. | |
| 8,871,639 B2 | 10/2014 | Chien et al. | |
| 9,018,776 B2 | 4/2015 | Song et al. | |
| 9,583,358 B2 | 2/2017 | Kim et al. | |
| 2002/0051931 A1 | 5/2002 | Mori et al. | |
| 2003/0203314 A1 | 10/2003 | Sebald et al. | |
| 2005/0250052 A1 | 11/2005 | Nguyen | |
| 2007/0026682 A1 | 2/2007 | Hochberg et al. | |
| 2007/0148557 A1 | 6/2007 | Takei et al. | |
| 2008/0032176 A1 | 2/2008 | Shimizu et al. | |
| 2009/0011204 A1 | 1/2009 | Wang et al. | |
| 2009/0140350 A1* | 6/2009 | Zhu ............... | H01L 21/0337 257/397 |
| 2009/0297784 A1 | 12/2009 | Xu et al. | |
| 2010/0055464 A1 | 3/2010 | Sung | |
| 2010/0086463 A1 | 4/2010 | Rudhard et al. | |
| 2010/0218801 A1 | 9/2010 | Sung et al. | |
| 2010/0316950 A1 | 12/2010 | Oguro et al. | |
| 2011/0014111 A1 | 1/2011 | Leugers et al. | |
| 2011/0210282 A1 | 9/2011 | Foley | |
| 2011/0244142 A1 | 10/2011 | Cheng et al. | |
| 2012/0153511 A1 | 6/2012 | Song et al. | |
| 2012/0181507 A1 | 7/2012 | Dimitrakopoulos et al. | |
| 2012/0193610 A1 | 8/2012 | Kim | |
| 2012/0245058 A1 | 9/2012 | Monteiro et al. | |
| 2013/0011630 A1* | 1/2013 | Sullivan ............... | C08G 77/58 428/195.1 |
| 2013/0119350 A1 | 5/2013 | Dimitrakopoulos et al. | |
| 2013/0133925 A1 | 5/2013 | Kim et al. | |
| 2013/0203198 A1 | 8/2013 | Min et al. | |
| 2013/0236715 A1 | 9/2013 | Zhamu et al. | |
| 2013/0313523 A1 | 11/2013 | Yun et al. | |
| 2014/0015000 A1 | 1/2014 | Nishiyama et al. | |
| 2014/0098458 A1 | 4/2014 | Almadhoun et al. | |
| 2014/0183701 A1 | 7/2014 | Choi et al. | |
| 2014/0186777 A1 | 7/2014 | Lee et al. | |
| 2014/0187035 A1* | 7/2014 | Posseme ............ | H01L 21/02063 438/618 |
| 2014/0239462 A1 | 8/2014 | Shamma et al. | |
| 2014/0299841 A1 | 10/2014 | Nourbakhsh et al. | |
| 2014/0320959 A1 | 10/2014 | Jun et al. | |
| 2014/0342273 A1 | 11/2014 | Kim et al. | |
| 2015/0001178 A1 | 1/2015 | Song et al. | |
| 2015/0004531 A1 | 1/2015 | Choi et al. | |
| 2015/0008212 A1 | 1/2015 | Choi et al. | |
| 2015/0030968 A1 | 1/2015 | Schwab et al. | |
| 2015/0056394 A1 | 2/2015 | Rawls | |
| 2015/0064904 A1* | 3/2015 | Yao ............... | C08G 77/58 438/694 |
| 2015/0129809 A1 | 5/2015 | Gauthy et al. | |
| 2015/0137077 A1 | 5/2015 | Yun et al. | |
| 2015/0200090 A1* | 7/2015 | Chada ............... | C01G 41/00 438/694 |
| 2015/0200091 A1* | 7/2015 | Chada ............... | H01L 21/02172 438/694 |
| 2015/0307730 A1 | 10/2015 | Hersam et al. | |
| 2015/0348794 A1* | 12/2015 | Kim ............... | H01L 21/324 438/703 |
| 2015/0376014 A1 | 12/2015 | Cesareo et al. | |
| 2015/0377824 A1 | 12/2015 | Ruhl et al. | |
| 2016/0005625 A1* | 1/2016 | Shin ............... | C08G 83/001 438/703 |
| 2016/0011511 A1 | 1/2016 | Shin et al. | |
| 2016/0027645 A1* | 1/2016 | Shin ............... | H01L 21/0332 438/703 |
| 2016/0043384 A1 | 2/2016 | Zhamu et al. | |
| 2016/0130151 A1 | 5/2016 | Kurungot et al. | |
| 2016/0152748 A1 | 6/2016 | Goffredi et al. | |
| 2016/0179005 A1 | 6/2016 | Shamma et al. | |
| 2016/0211142 A1 | 7/2016 | Kim et al. | |
| 2016/0225991 A1 | 8/2016 | Schwab et al. | |
| 2016/0240841 A1 | 8/2016 | He et al. | |
| 2016/0282721 A1 | 9/2016 | Seol et al. | |
| 2016/0284811 A1 | 9/2016 | Yu et al. | |
| 2016/0291472 A1 | 10/2016 | Shin et al. | |
| 2016/0346769 A1 | 12/2016 | Kim et al. | |
| 2016/0369149 A1 | 12/2016 | Liu et al. | |
| 2017/0040178 A1 | 2/2017 | Kim et al. | |

FOREIGN PATENT DOCUMENTS

| | | |
|---|---|---|
| EP | 1703328 A1 | 9/2006 |
| EP | 2950334 A1 | 12/2015 |
| JP | 4488234 B2 | 6/2010 |
| JP | 4531400 B2 | 8/2010 |
| JP | 2013208881 A | 10/2013 |
| KR | 10-1057218 B1 | 8/2011 |
| KR | 20110090368 A | 8/2011 |
| KR | 2011-0138611 A | 12/2011 |
| KR | 10-1114131 B1 | 3/2012 |
| KR | 2012-0024756 A | 3/2012 |
| KR | 20120077466 A | 7/2012 |
| KR | 101257694 B1 | 4/2013 |
| KR | 2013/0062924 A | 6/2013 |
| KR | 10H01343014 B1 | 12/2013 |
| KR | 2013/0132103 A | 12/2013 |
| KR | 101343014 B1 | 12/2013 |
| KR | 10-1423171 B1 | 7/2014 |
| KR | 10-1439030 B1 | 9/2014 |
| WO | WO-2013/100365 A1 | 7/2013 |
| WO | WO-2014/135455 A1 | 9/2014 |

OTHER PUBLICATIONS

Zhang, et al. "Fabrication of highly oriented reduced graphene oxide microbelts array for massive production of sensitive ammonia gas sensors", Journal of MicroMechanics and MicroEngineering, vol. 23, pp. 1-8, (2013).

Huang, et al. "An innovative way of etching MoS2: Characterization and mechanistic investigation", Nano Research, vol. 6, No. 3, pp. 200-207, (2013).

Hwang, et al. "Transparent actuator made with few layer graphene electrode and dielectric elastomer, for variable focus lens", Applied Physics Letters, vol. 103, pp. 023106-1-023106-5, (2013).

"A Guide to Silane Solutions. Silane Coupling Agents," Down Corning, 2009, pp. 1-7.

(56) References Cited

OTHER PUBLICATIONS

Nazarov, et al. "Functionalization and dispersion of h-BN nanosheets treated with inorganic reagents", Chemistry an Asian Journal, DOI: 10.1002/asia.201100710, vol. 7, Issue 3, 2012, pp. 554-560.
Grenadier, et al. "Dry etching techniques for active devices based on hexagonal boron nitride epilayers", Journal of Vacuum Science & Technology A:, vol. 21, No. 6, 2013, pp. 061517-1-061517-3.
Hascik, et al. "Dry etching of carbon layers in various etch gases", Vacuum, vol. 58, 2000, pp. 434-439.
U.S. Office Action dated Aug. 16, 2016 issued in co-pending U.S. Appl. No. 14/791,912.
Notice of Allowance dated Oct. 19, 2016 issued in co-pending U.S. Appl. No. 14/725,390.
Office Action dated Feb. 8, 2017 issued in co-pending U.S. Appl. No. 14/791,912.
Office Action dated Jun. 13, 2017 issued in co-pending U.S. Appl. No. 14/791,912.
Notice of Allowance dated Aug. 28, 2017 issued in co-pending U.S. Appl. No. 14/791,912.
U.S. Office Action dated Dec. 5, 2017 issued in co-pending U.S. Appl. No. 15/611,935.
U.S. Notice of Allowance dated Nov. 3, 2017 issued in co-pending U.S. Appl. No. 14/791,912.
U.S. Notice of Allowance dated Aug. 28, 2017 issued in co-pending U.S. Appl. No. 14/791,912.
U.S. Office Action dated Jun. 13, 2017 issued in co-pending U.S. Appl. No. 14/791,912.
U.S. Office Action dated Mar. 22, 2016 issued in co-pending U.S. Appl. No. 14/725,390.
U.S. Notice of Allowance dated Mar. 15, 2017 issued in co-pending U.S. Appl. No. 14/697,150.
U.S. Office Action dated Sep. 30, 2016 issued in co-pending U.S. Appl. No. 14/697,150.
U.S. Office Action dated Mar. 28, 2016 issued in co-pending U.S. Appl. No. 14/697,150.
U.S. Office Action dated Oct. 6, 2017 issued in co-pending U.S. Appl. No. 14/843,003.
Office Action dated May 8, 2017 in co-pending U.S. Appl. No. 14/843,003.
U.S. Office Action dated May 10, 2016 issued in co-pending U.S. Appl. No. 14/791,912.
U.S. Office Action dated Feb. 22, 2018 issued in co-pending U.S. Appl. No. 14/825,792.
U.S. Office Action dated Feb. 21, 2018 issued in corresponding U.S. Appl. No. 15/332,287.
U.S. Appl. No. 14/791,912, filed Jul. 6, 2015.
U.S. Appl. No. 15/332,287, filed Oct. 24, 2016.
U.S. Appl. No. 14/825,792, Aug. 13, 2015.
U.S. Appl. No. 14/843,003, Sep. 2, 2015.
U.S. Notice of Allowance dated Feb. 1, 2018 issued in co-pending U.S. Appl. No. 14/791,912.
U.S. Office Action dated May 22, 2018 issued in U.S. Appl. No. 14/843,003.
U.S. Notice of Allowance dated Jul. 16, 2018 issued in U.S. Appl. No. 14/825,792.
European Search Report dated Aug. 17, 2016 cited in corresponding European Application No. 15193939.4.
Song et al., "Highly Efficient Light-Emitting Diode of Graphene Quantum Dots Fabricated from Graphite Intercalation Compounds," Advanced Optical Materials, pp. 1-8 (2014).
Wang et al., "Gram-scale synthesis of single-crystalline graphene quantum dots with superior optical properties," Macmillian Publishers Limited, pp. 1-9 (2014).
Shin et al., "Mass Production of Graphene Quantum Dots by One-Pot Synthesis Directly from Graphite in High Yield", Small-journal.com, vol. 10, No. 5, pp. 866-870 (2014).

* cited by examiner

HARDMASK COMPOSITION AND METHOD OF FORMING PATTERNING BY USING THE HARDMASK COMPOSITION

RELATED APPLICATION

This application is a divisional application of U.S. application Ser. No. 14/697,150, filed on Apr. 27, 2015, which claims the benefit of priority from Korean Patent Application No. 10-2014-0095007, filed on Jul. 25, 2014, in the Korean Intellectual Property Office, the entire contents of each of which is hereby incorporated by reference.

BACKGROUND

1. Field

Example embodiments relate to a hardmask composition, and/or a method of forming a pattern by using the hardmask composition.

2. Description of the Related Art

The semiconductor industry has developed an ultra-fine technique for providing a pattern of several to several nanometers in size. Such an ultrafine technique benefits from effective lithographic techniques. A typical lithographic technique includes providing a material layer on a semiconductor substrate, coating a photoresist layer on the material layer, exposing and developing the same to provide a photoresist pattern, and etching the material layer by using the photoresist pattern as a mask.

When minimizing the pattern to be formed, it may be difficult to provide a fine pattern having a desirable profile by using only the typical lithographic technique described above. Accordingly, a layer, referred to herein as "a hardmask", may be formed between the material layer to be etched and the photoresist layer to provide a fine pattern. The hardmask serves as an interlayer that transfers the fine pattern of the photoresist to the material layer through a selective etching process. Thus, the hardmask layer needs to have chemical resistance, thermal resistance, and etching resistance in order to tolerate various types of etching processes.

As semiconductor devices have become highly integrated, although a line-width of a material layer has gradually narrowed, a height of the material layer has remained the same or has increased relative to the photoresist layer. Thus, an aspect ratio of the material layer has increased. Since an etching process needs to be performed under such conditions, the heights of a photoresist layer and a hardmask pattern also need to be increased. However, the increase in heights of a photoresist layer and a hardmask pattern is limited. In addition, the hardmask pattern may be damaged during the etching process for obtaining a material layer with a narrow line-width, and thus electrical characteristics of devices may deteriorate.

In this regard, methods have been suggested to use a single layer or multiple layers, in which a plurality of layers are stacked, of a conductive or insulating material such as a polysilicon layer, a tungsten layer, and a nitride layer. However, the use of the single layer or of multiple layers requires a high deposition temperature, which may result in modifications to the physical properties of the material layer.

SUMMARY

Example embodiments relate to a hardmask composition with improved etching resistance.

Example embodiments relate to a method of forming a pattern by using the hardmask composition.

Additional example embodiments will be set forth in part in the description which follows and, in part, will be apparent from the description, or may be learned by practice of the example embodiments.

According to at least one example embodiment, a hardmask composition includes at least one of a two-dimensional layered nanostructure and its precursor; and a solvent, wherein an amount of the at least one of a two-dimensional layered nanostructure, and its precursor is about 0.01 part to about 40 parts by weight based on 100 parts by weight of the hardmask composition.

According to another example embodiment, a method of forming a pattern includes forming a to-be-etched layer on a substrate, forming a hardmask by providing the hardmask composition or a two-dimensional layered nanostructure precursor on the to-be-etched layer, forming a photoresist layer on the hardmask, forming a hardmask pattern including a two-dimensional layered nanostructure on the to-be-etched layer by etching the two-dimensional carbon nanostructure by using the photoresist layer as an etching mask, and etching the to-be-etched layer by using the hardmask pattern as an etching mask.

BRIEF DESCRIPTION OF THE DRAWINGS

These and/or other example embodiments will become apparent and more readily appreciated from the following description of the embodiments, taken in conjunction with the accompanying drawings in which.

DETAILED DESCRIPTION

Figure 1A:
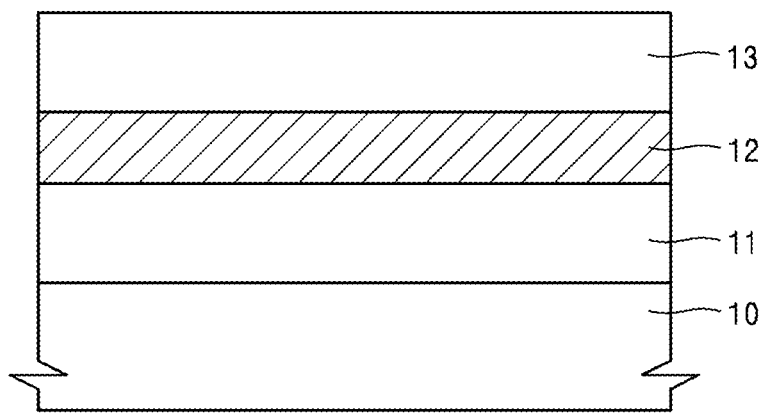
FIGS. 1A to 1E illustrate a method of forming a pattern by using a hardmask composition according to an example embodiment.

Reference will now be made in detail to example embodiments, illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on," "connected" or "coupled" to another element, it can be directly on, connected or coupled to the other element or intervening elements may be present. In contrast, when an element is referred to as being "directly on,"

"directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Hereinafter, a hardmask composition according to an example embodiment and a method of forming a pattern by using the hardmask composition will be described in detail.

According to an example embodiment, a hardmask composition includes at least one of a two-dimensional layered nanostructure and its precursor; and a solvent.

As used herein, the term "two-dimensional layered nanostructure" denotes a compound of an arbitrary solid form or crystallite size. Typical forms of the two-dimensional layered nanostructure include a powder or a single crystal but are not limited thereto. A typical crystallite size of the two-dimensional layered nanostructure is several nanometers to several tens of micrometers, and when the two-dimensional layered nanostructure is a single crystal, the crystallite size of the two-dimensional layered nanostructure is up to several millimeters.

In this regard, a particle size of the two-dimensional layered nanostructure is not limited. In general, typical particles of commercially available two-dimensional layered nanostructures have a particle size ranging from about several hundreds of nanometers to several tens of micrometers, and when a particle size increases, the structure may have a layered form, and thus a thin film may be easily formed. Accordingly, etching resistance of the structure improves, but dispersing the particles in the structure may present challenges. Meanwhile, when a particle size decreases, the structure may not have a layered form, and thus a composite film prepared by using the structure may not have a desired surface roughness.

The two-dimensional layered nanostructure may be, for example, at least one of a hexagonal boron nitride derivative having a layered structure, a metal chalcogenide-based material, and a metal oxide.

In example embodiments, a commercially available two-dimensional layered nanostructure may be purchased and used as it is. Alternatively, the two-dimensional layered nanostructure may be prepared by performing mechanical pulverization by directly milling the two-dimensional layered nanostructure in a ball mill or treating the two-dimensional layered nanostructure with ultrasonic waves in a solvent.

In example embodiments, the two-dimensional layered nanostructure may be a structure that is prepared by expanding or laminating the two-dimensional layered nanostructure.

A precursor of the two-dimensional layered nanostructure refers to all starting materials that are used to form the two-dimensional layered nanostructure. Examples of the precursor may include ammonia borane or borazine precursors.

An amount of the at least one of a two-dimensional layered nanostructure and its precursor may be in a range of about 0.01 part to about 40 parts by weight, for example, about 0.05 part to about 10 parts by weight, for example, about 1 part to about 5 parts by weight, based on 100 parts by weight of the hard mask composition.

When an amount of the at least one of a two-dimensional layered nanostructure and its precursor is less than 0.01 part by weight, the hardmask prepared by using the hardmask composition may not be controlled to have a desired thickness, and when an amount of the at least one of a two-dimensional layered nanostructure and its precursor is higher than 40 parts by weight, a film-forming property of the hardmask composition decreases, and thus a hardmask may not be easily prepared.

Figure 1B:
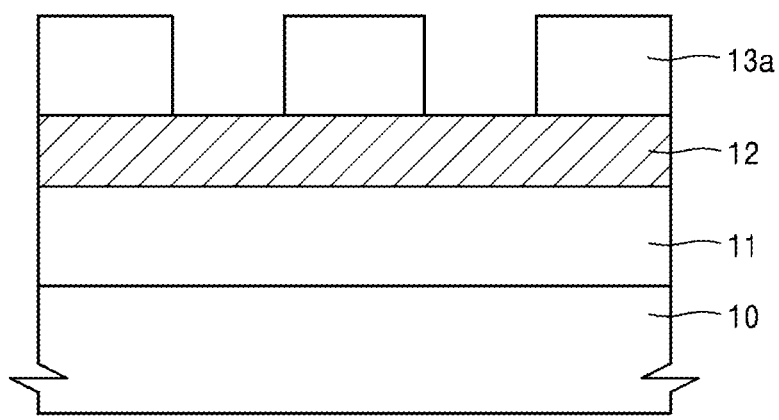
Figure 1C:
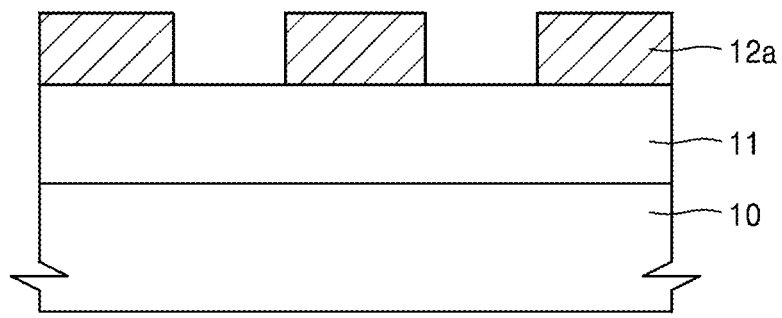
Figure 1D:
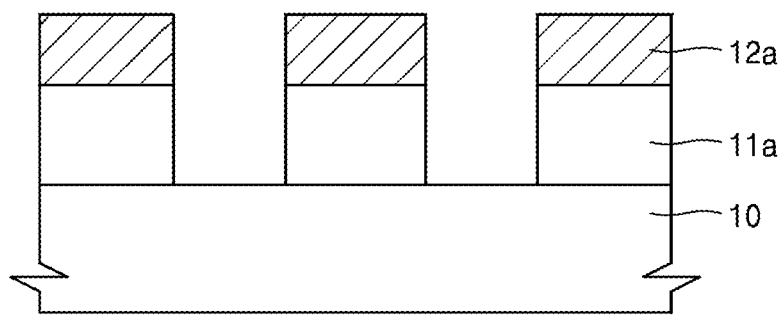
Figure 1E:
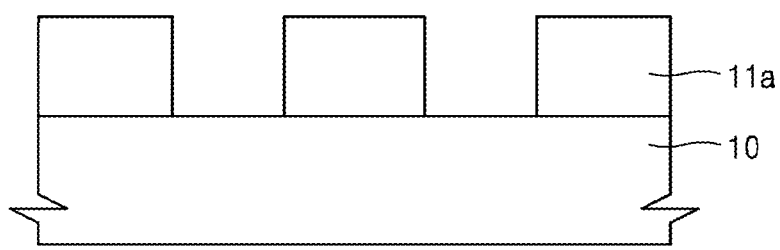
Figure 1F:
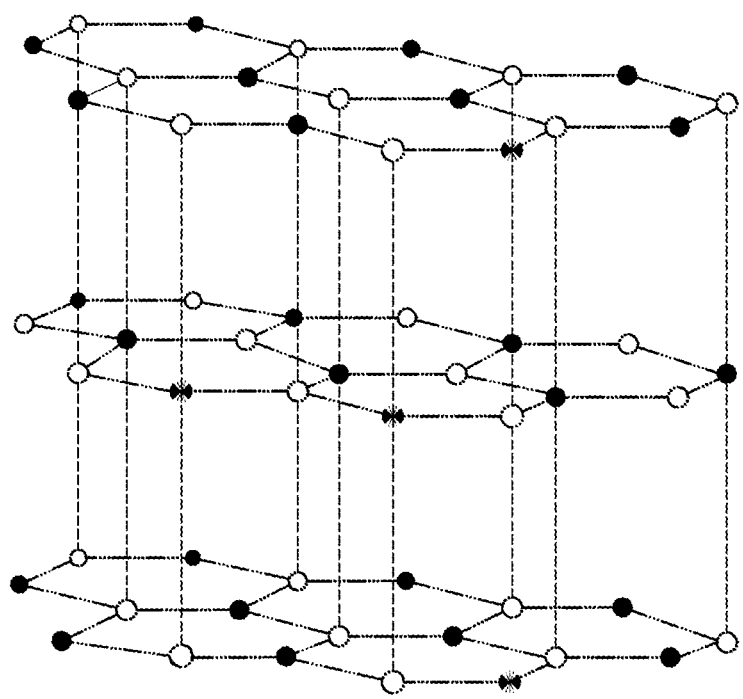
FIG. 1F schematically illustrates hexagonal boron nitride particles.

The two-dimensional layered nanostructure has layers stacked and aligned into a planar shape, as shown in FIG. 1F, to provide a large surface area.

The hexagonal boron nitride derivative is a hexagonal boron nitride (h-BN) or a hexagonal boron carbonitride (h-BxCyNz) (where the sum of x, y, and z is equal to 3). In the hexagonal boron nitride derivative, boron and nitrogen atoms are regularly included in a hexagonal ring, or some of boron and nitrogen atoms are substituted with carbon atoms while maintaining a hexagonal ring.

The metal chalcogenide-based material is a compound including at least one of Group 16 (chalcogenide) element and one or more electropositive elements. For example, the metal chalcogenide-based material may include one or more metal elements such as molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), and lead (Pb), and one chalcogenide element such as sulfur (S), selenium (Se), and tellurium (Te).

The metal chalcogenide-based material may be one of molybdenum sulfide ($MoS_2$), molybdenum selenide ($MoSe_2$), molybdenum telluride ($MoTe_2$), tungsten sulfide ($WS_2$), tungsten selenide ($WSe_2$), and tungsten telluride ($WTe_2$). In some embodiments, the metal chalcogenide-based material may be molybdenum sulfide ($MoS_2$).

The metal oxide may be, for example, at least one of $MoO_3$, $WO_3$, and $V_2O_5$ having a two-dimensional layered structure.

The hexagonal boron nitride has a flat hexagonal crystal structure, the vertices of which are occupied alternatively by boron and nitrogen atoms. A layered structure of the hexagonal boron nitride is a structure in which a boron atom and a nitrogen atom neighboring each other are overlapped due to their polarities, where the structure is also referred to as "an AB stacking". Here, the hexagonal boron nitride may have a layered structure, in which nanolevel-thin sheets are stacked in layers, and the layered structure may be separated or detached from each other to form a single layer or multiple layers of a hexagonal boron nitride sheet.

The hexagonal boron nitride according to an example embodiment may have a Raman peak at about 1360 $cm^{-1}$ in Raman spectrum analysis. This location of the peak provides information about the number of layers in the hexagonal boron nitride. Through atomic force microscopic (AFM) analysis, Raman spectrum analysis, and transmission electron microscope (TEM) analysis performed on the hexagonal boron nitride, it may be known that the hexagonal boron nitride has a nanosheet structure.

X-ray diffraction analysis using CuKα is performed on the hexagonal boron nitride, and as the result of the X-ray analysis, the hexagonal boron nitride may include a two-dimensional layered structure having a (002) crystal face. A peak of the (002) crystal face is within a range of about 20° to about 27°.

An interlayer distance (d-spacing) of the two-dimensional carbon nanostructure obtained from the X-ray diffraction analysis is in a range of about 0.3 nm to about 0.7 nm, for example, about 0.334 nm to about 0.478 nm. In addition, an average particle diameter of the hexagonal boron nitride crystals obtained from the X-ray diffraction analysis is about 1 nm or greater, or for example, in a range of about 23.7 Å to about 43.9 Å. When the interlayer distance is within this range, the hardmask composition may have excellent etching resistance.

The hexagonal boron nitride is formed as a single layer of a two-dimensional boron nitride or multiple layers of a two-dimensional boron nitride.

A thickness of the two-dimensional layered nanostructure according to an example embodiment may be, for example, in a range of about 0.34 nm to about 100 nm. The two-dimensional layered nanostructure may include a different number of layers, for example, one layer to three hundred layers, or, for example, one layer to ten layers. For example, the two-dimensional layered nanostructure may be stable in a single layer.

The two-dimensional layered nanostructure has a low reactivity with respect to a fluorocarbon-based gas, which is an etching gas used to perform etching on a material layer including $SiO_2$ or SiN, and thus when the two-dimensional layered nanostructure is used, etching resistance of the two-dimensional layered nanostructure may increase. For example, the fluorocarbon-based gas is $CF_4$, $CHF_3$, $C_2F_6$, $C_2F_4$, $C_3F_8$, or $C_4F_8$.

Also, when an etching gas, $SF_6$ or $XeF_6$, with a low reactivity with respect to $SiO_2$ or SiNx is used, etching may be easily performed on the two-dimensional layered nanostructure, and thus ashing may be easily performed thereon as well. Moreover, the two-dimensional layered nanostructure may be a material having a band gap which has a transparent property, and thus an additional align mask may not be needed in the preparation process.

Examples of a method of forming a hardmask by using the two-dimensional layered nanostructure include a method of forming a hardmask by separating one to several layers from 3-dimensional flakes of tens μm in size including several hundreds of layers to obtain a hardmask composition and preparing a thin-film by using the hardmask composition to obtain a hardmask, and a method of forming a hardmask by directly vapor depositing several tens of layers on a substrate.

An exfoliated hexagonal boron nitride, metal chalcogenide-based, or metal oxide may be obtained by intercalating an interlayer insertion material between flakes of a 3-dimensional hexagonal boron nitride, metal chalcogenide-based, or metal oxide of tens of μm in size, and an expanded structure of the two-dimensional layered nanostructure is obtained by using the exfoliated hexagonal boron nitride, metal chalcogenide-based, or metal oxide to obtain a hardmask composition including the expanded structure.

The expanded structure of the two-dimensional layered nanostructure may include different number of layers, for example, one layer to three hundred layers, or, for example, one layer to sixty layers, one layer to fifteen layers, or one layer to ten layers.

Additionally, ultrasound waves or microwaves may be applied to the expanded structure or the expanded structure may undergo a milling process to obtain a two-dimensional layered nanostructure precursor. Here, the milling process may be performed by using a ball mill or a monoplanetary mill.

Optionally, the expanded structure may undergo a liquid exfoliating process including dispersion in a solvent. When the expanded structure undergoes the liquid exfoliating process, a two-dimensional layered nanostructure precursor including one to several tens of layers may be obtained.

The interlayer insertion material may include at least one of sulfuric acid, chromic acid, lithium, ions such as potassium, or sodium, and ion containing compounds having the ions.

In the liquid exfoliating process, examples of the solvent may include 1,2-dichlorobenzene, 1,2-dichloroethane, N,N-dimethylformamide, N-methyl pyrrolidone, and ethanol, and ultrasound waves may be used in the dispersion process. For example, the process of dispersion in the solvent may be performed for about 0.5 to 30 hours.

An organic functional group, such as —OH, —NH$_3$, —COOH, an amino group, a sulfonic acid, may be introduced to the two-dimensional layered nanostructure or its expanded structure to increase dispersing property of the structure. In this regard, when an organic functional group is introduced to the structure, a solubility and an interaction between layers of the layered structure may be controlled.

For example, introducing an organic functional group to the two-dimensional layered nanostructure or its structure may be performed by supplying a raw material gas, which provides a functional group, to the two-dimensional layered nanostructure or its expanded structure contained in an autoclave. Here, a temperature of the autoclave may be, for example, in a range of about 80° C. to about 300° C., and the raw material gas may be at least one of H$_2$O$_2$, NH$_3$, and N$_2$H$_4$. The raw material gas may be introduced to the two-dimensional layered nanostructure or its expanded structure. The amount of the raw material gas is from about 1 part by weight to about 100 parts by weight based on 1 part by weight of at least one of the two-dimensional layered nanostructure and its structure.

A hardmask composition including the two-dimensional layered nanostructure or its structure may further include a surfactant to increase a dispersibility of each component constituting the composition.

Examples of the surfactant may include sodium dodecyl-benzylsulfide (NaDDBS), sodium dodecyl sulfide (SDS), sodium dodecylbezylsulfate, sodium dodecyl sulfate, and Triton X-100. Also, an amount of the surfactant may be in a range of about 0.01 part to about 100 parts by weight based on 100 parts by weight of at least one of two-dimensional layered nanostructure and its precursor.

In one example embodiment, when a laminated structure of the two-dimensional layered nanostructure is obtained by applying ultrasound waves to an expanded structure of the two-dimensional layered nanostructure, the ultrasound waves may be applied within a frequency range of about 20 KHz to about 60 KHz.

In another example embodiment, when a further expanded structure is obtained by applying microwaves to an expanded structure of the two-dimensional layered nanostructure, the microwaves may have an output in a range of about 50 W to about 1500 W and a frequency range of about 2.45 GHz to about 60 GHz. A period of time for applying the microwaves may vary depending on the frequency of the microwaves, but, for example, the microwaves may be applied to the expanded structure of the two-dimensional layered nanostructure for about 10 minutes to about 30 minutes.

The two-dimensional layered nanostructure as a starting material may be natural, artificial, or a mixture thereof.

Examples of the method of forming a hardmask by directly depositing several tens of layers of the two-dimensional layered nanostructure on a substrate may include a method of directly growing a precursor of the two-dimensional layered nanostructure on a substrate.

A precursor of the hexagonal boron nitride may include ammonia borane or borazine. Also, a precursor material of the metal chalcogenide-based material may include a metal oxide. Also, a thin-film including the metal chalcogenide-based material may be obtained by, for example, performing an annealing process while supplying sulfur to a precursor, such as metal oxide or (NH$_4$)$_2$MoS$_4$.

The metal oxide may be deposited on a substrate by using an e-beam or a sputter. Examples of the metal oxide may include a molybdenum oxide or a tungsten oxide, and examples of the metal chalcogenide-based material may include a molybdenum sulfide or a tungsten sulfide.

The annealing process may be performed at a temperature, for example, in a range of about 300° C. to about 2,000° C. Then, a further annealing process may be performed through additional thermal treatment.

When a hardmask is prepared using a hardmask composition according to an example embodiment, etching resistance of the hardmask during the etching process may improve. Also, the adhering strength between neighboring layers and the hardmask increase.

Since a hardmask prepared by using a conventional amorphous carbon mainly includes a sp2 carbon bonding structure, etching resistance of the hardmask may be good, but a transparency of the hardmask is low, and thus problems may occur when the hardmask is aligned, and many particles may be generated during a deposition process. Therefore, an example hardmask prepared by using diamond-like carbon having a sp3 carbon bonding structure has been developed. However, applying this hardmask to a preparation process is limited due to the low etching resistance of the hardmask.

When the two-dimensional layered nanostructure according to an example embodiment is used to prepare a hardmask, the hardmask has improved layer stability, improved transparency, and improved etching resistance.

As the results of X-Ray Diffraction (XRD) analysis, the two-dimensional layered nanostructure according to an example embodiment has crystallinity in a C-axis (a perpendicular direction of the layers), and an average particle diameter of the crystals of the two-dimensional layered nanostructure is 1 nm or higher. An average particle diameter of the crystals may be, for example, in a range of about 1.0 Å to about 1000 Å, or, for example, about 23.7 Å to about 43.9 Å. When an average particle diameter of the crystals of the two-dimensional layered nanostructure is within these ranges, the hardmask including the two-dimensional layered nanostructure may have excellent etching resistance.

The hardmask composition according to an example embodiment may have excellent coating and film-forming properties, etching-resistance of a hardmask prepared by using the hardmask may have excellent etching resistance, an adhering strength of the hardmask to a neighboring layer improves, and the hardmask may have excellent layer stability.

In the hardmask composition according to an example embodiment, any solvent capable of dissolving or dispersing at least one of the two-dimensional layered nanostructure and its precursor may be used. For example, the solvent may be at least one of water, an alcohol-based solvent, and an organic solvent.

Examples of the alcohol-based solvent may include methanol, ethanol, and isopropanol, and examples of the organic solvent may include at least one of N,N-dimethylformamide, N-methylpyrrolidone, dichloroethane, dichlorobenzene, N,N-dimethylsulfoxide, xylene, aniline, propylene glycol, propylene glycol diacetate, methoxypropanediol, diethyleneglycol, gamma-butyrolactone, acetylacetone, cyclohexanone, propylene glycol monomethyl ether acetate, γ-butyrolactone, dichloroethane, O-dichlorobenzene, nitromethane, tetrahydrofuran, nitromethane, dimethyl sulfoxide, nitrobenzene, butyl nitrite, methylcellosolve, ethylcellosolve, diethylether, diethyleneglycolmethylether, diethyleneglycolethylether, dipropyleneglycolmethylether, toluene, xylene, hexane, methylethylketone, methylisoketone, hydroxymethylcellulose, and heptane.

An amount of the solvent may be about 100 parts to about 100,000 parts by weight based on 100 parts by weight of the total weight of the first material and the second material. When an amount of the solvent is within this range, the hardmask composition may have an appropriate viscosity and thus may easily form a layer.

A hardmask prepared by using the hardmask composition according to the example embodiments is an anti-reflection layer within a deep UV (DUV) wavelength region, e.g., ArF (about 193 nm) and KrF (about 248 nm). The hardmask has a refractive index and absorbance within appropriate ranges, and thus a reflectivity between a resist and a lower layer may be reduced. When a pattern is formed by using the hardmask composition, the hardmask composition may have a high etching selectivity and sufficient resistance to multi-etching and thus may provide an excellent lithographic structure in terms of pattern profile or margins.

The hardmask composition according to an example embodiment may further include at least one of the two-dimensional carbon nanostructure containing about 0.01 atom % to about 40 atom % of oxygen and its precursor.

According to an example embodiment, the composition may further include at least one of an aromatic ring-containing monomer and a polymer containing a repeating unit that includes an aromatic ring-containing monomer.

According to another example embodiment, the composition may further include a two-dimensional carbon nanostructure and at least one of an aromatic ring-containing monomer, and a polymer containing a repeating unit that includes an aromatic ring-containing monomer.

As used herein, the term "two-dimensional carbon nanostructure" refers to a sheet structure of a single atomic layer formed by a carbon structure that forms polycyclic aromatic molecules in which a plurality of carbon atoms are covalently bound to one another and aligned into a planar shape, a network structure in which a plurality of carbon structures each having a plate shape of a small piece of film are interconnected and aligned into a planar shape, or a combination thereof. The covalently bound carbon atoms form repeating units that comprise 6-membered rings but may also form 5-membered rings and/or 7-membered rings. The carbon structure may be formed by stacking a plurality of layers including several sheet structures and/or network structures, and an average thickness of the carbon structure may be about 100 nm or less, for example, about 10 nm or less, or in a range of about 0.01 nm to about 10 nm. The two-dimensional carbon nanostructure according to an example embodiment may include oxygen atoms in addition to carbon atoms rather than being a complete C=C/C—C conjugated structure. Also, the two-dimensional carbon nanostructure may have a carboxyl group, a hydroxyl group, an epoxy group, or a carbonyl group at its end.

An oxygen content of the two-dimensional carbon nanostructure may be, for example, in a range of about 6 atom % to about 20 atom %, for example, about 10 atom % to about 15 atom %. In the two-dimensional carbon nanostructure, the oxygen content may be confirmed by, for example, an X-ray Photoelectron Spectroscopy (XPS) analysis. When an oxygen content is less than 0.01 atom % in the two-dimensional carbon nanostructure, a bond with an aromatic ring compound may not be formed, and when an oxygen content is higher than 40 atom %, degassing may occur during an etching process. Also, the two-dimensional carbon nanostructure has an oxygen content within the ranges described above, and thus may have hydrophilic property so that a bonding strength to another layer may improve. Also, a dispersing property of the two-dimensional carbon nanostructure in a solvent may improve, and thus the hardmask composition may be more easily prepared. In addition, due to the high bond-dissociation energy of a functional group including an oxygen atom, etching resistance to an etching gas may improve.

The two-dimensional carbon nanostructure according to an example embodiment may have Raman peaks observed at about 1340 $cm^{-1}$ to about 1350 $cm^{-1}$, about 1580 $cm^{-1}$, and about 2700 $cm^{-1}$ in Raman spectrum analysis. The peaks provide information of a thickness, a crystallinity, and a charge doping status of the two-dimensional carbon nanostructure. The peak observed at about 1580 $cm^{-1}$ is a "G mode" peak, which is generated by a vibration mode corresponding to stretching of a carbon-carbon bond. Energy of the "G mode" is determined by a density of excess charge doped in the two-dimensional carbon nanostructure. Also, the peak observed at about 2700 $cm^{-1}$ is a "2D mode" peak that is useful in the evaluation of a thickness of the two-dimensional carbon nanostructure. The peak observed at about 1340 $cm^{-1}$ to about 1350 $cm^{-1}$ was a "D mode" peak, which appears when an $sp^2$ crystal structure has defects and is mainly observed when many defects are found around edges of a sample or in the sample itself. Also, a ratio of a D peak intensity to a G peak intensity (a D/G intensity ratio) provides information of a degree of disorder of crystals of the two-dimensional carbon nanostructure.

An intensity ratio ($I_D/I_G$) of a D mode peak to a G mode peak obtained from Raman spectroscopy analysis of the two-dimensional carbon nanostructure is 2 or lower. For example, the intensity ratio ($I_D/I_G$) is within a range of about 0.001 to about 2.0. An intensity ratio ($I_D/I_G$) of a D mode peak to a G mode peak obtained from Raman spectroscopy analysis of the two-dimensional carbon nanostructure precursor is 2 or lower. For example, the intensity ratio ($I_D/I_G$) is within a range of about 0.001 to about 2.0.

An intensity ratio ($I_{2D}/I_G$) of a 2D mode peak to a G mode peak obtained from Raman spectroscopy analysis of the two-dimensional carbon nanostructure is 0.01 or higher. For example, the intensity ratio ($I_{2D}/I_G$) is within a range of about 0.01 to about 1.0, or about 0.05 to about 0.5. When the intensity ratio of a D mode peak to a G mode peak and the intensity ratio of a 2D mode peak to a G mode peak are within the ranges above, the two-dimensional carbon nanostructure may have a high crystallinity and a small defect, and thus a bonding energy of the two-dimensional carbon nanostructure increases so that a hardmask prepared by using the two-dimensional carbon nanostructure may have excellent etching resistance.

X-ray diffraction analysis using CuKα is performed on the two-dimensional carbon nanostructure, and as the result of the X-ray analysis, the two-dimensional carbon nanostructure may include a two-dimensional layered structure having a (002) crystal face peak. A peak of the (002) crystal face is observed within a range of about 20° to about 27°. An interlayer distance (d-spacing) of the two-dimensional carbon nanostructure obtained from the X-ray diffraction analysis is in a range of about 0.3 nm to about 0.7 nm, for example, about 0.334 nm to about 0.478 nm. In addition, an average particle diameter of the crystals obtained from the X-ray diffraction analysis is about 1 nm or greater, or for example, in a range of about 23.7 Å to about 43.9 Å. When the conditions are within these ranges, the hardmask composition may have excellent etching resistance.

The two-dimensional carbon nanostructure is formed as a single layer of two-dimensional nanocrystalline carbon or multiple layers of two-dimensional nanocrystalline carbon.

The two-dimensional carbon nanostructure according to an example embodiment has a higher content of sp2 carbon than the carbon nanostructure of sp3 carbon and a high oxygen content compared to a conventional amorphous carbon layer. An sp2 carbon bond (that is, a bond of an aromatic structure) has a higher bonding energy than that of an sp3 carbon bond. The sp3 structure is a 3-dimensional bonding structure of diamond having a tetrahedral shape, and the sp2 structure is a two-dimensional bonding structure of graphite in which a carbon to hydrogen ratio (a C/H ratio) increases and thus may secure resistance to dry etching. In the two-dimensional carbon nanostructure, an sp2 carbon fraction is equal to or a multiple of an sp3 carbon fraction. For example, an sp2 carbon fraction is a multiple of an sp3 carbon fraction by about 1.0 to about 10, or by about 1.88 to 3.42.

An amount of the sp2 carbon atom bonding structure may be about 30 atom % or more, for example, about 39.7 atom % to about 62.5 atom %, in the C1s XPS analysis. When the mixing ratio is within this range, the bond energy of the two-dimensional carbon nanostructure is high, and thus bond breakage of the two-dimensional carbon nanostructure may be difficult. Thus, when the two-dimensional carbon nanostructure further added to a hardmask composition, bond strength between the hardmask and adjacent layers may increase as well as etching resistance characteristics during the etching process may improve.

The two-dimensional carbon nanostructure according to an example embodiment has crystallinity in a C-axis (a vertical direction of the layer) and an average particle diameter of about 1 nm or higher as in the result of XRD analysis. An average particle diameter of the crystals may be, for example, in a range of about 1.0 Å to about 1000 Å, or, for example, about 23.7 Å to about 43.9 Å. When an average particle diameter of the crystals is within this range, the hardmask may have excellent etching resistance.

Hereinafter, a method of preparing a hardmask by using the hardmask composition according to an example embodiment will be described in detail.

The hardmask composition according to an example embodiment includes at least one of a two-dimensional layered nanostructure and its precursor; and a solvent.

First, the case of a hardmask composition including a two-dimensional layered nanostructure will be described.

A top of a to-be-etched layer is coated with a hard mask composition including a two-dimensional layered nanostructure and a solvent to prepare a hardmask containing the two-dimensional layered nanostructure.

During or after the process of coating the to-be-etched layer with the hardmask composition, a heat-treating process may be performed. Conditions for the heat-treating process may vary depending on a material of the to-be-etched layer, but a temperature of the heat-treating process may be from room temperature (about 25° C.) to about 1500° C.

The heat-treating process is performed in an inert gas atmosphere or in vacuum. A heating source of the heat-treating process may be induction heating, radiant heat, lasers, infrared rays, microwaves, plasma, ultraviolet rays, or surface plasmon heating.

The inert gas atmosphere may be prepared by mixing a nitrogen gas and/or an argon gas.

After the heat-treating process, the solvent may be removed. The resultant from which the solvent is removed may be baked at a temperature of about 100° C. to about 400° C., and then another heat-treating process may be performed on the baked resultant at a temperature of about 400° C. to about 1,000° C.

When the temperatures of the heat-treating process and the baking process are within these ranges above, the hardmasks with excellent etching resistance may be prepared.

A heating rate in the heat-treating process and the baking process is about 1° C./min to about 1000° C./min. When a heating rate is within this range, the deposited layer may not be damaged due to a rapid temperature change, and thus a process efficiency may be excellent.

A hardmask may be prepared by coating a top of a to-be-etched layer with a hardmask composition including a precursor of the two-dimensional layered nanostructure and a solvent.

During or after the process of coating the to-be-etched layer with the hardmask composition, a heat-treating process may be performed. Conditions for the heat-treating process may vary depending on a purpose of the heat-treatment, but a temperature of the heat-treating process may be from about 300° C. to about 2000° C. When the temperature of the heat-treating process is within this range, the hardmasks prepared by using the hardmask composition may have improved etching resistance compared to other heat-treating temperatures.

In example embodiments, a hardmask may be prepared by depositing the precursor of the two-dimensional layered nanostructure on a top of a to-be-etched layer.

When the hardmask composition according to an example embodiment includes at least one of a two-dimensional carbon nanostructure and its precursor, a hardmask may be prepared in a manner described as follows.

The two-dimensional carbon nanostructure precursor may be a two-dimensional carbon nanostructure having less than 0.01 atom % of oxygen or an oxygen free two-dimensional carbon nanostructure.

The two-dimensional carbon nanostructure precursor according to an example embodiment may be, for example, expanded graphite obtained from exfoliated graphite. When expanded graphite is used as the two-dimensional carbon nanostructure precursor, self agglomeration of carbon layers constituting the two-dimensional carbon nanostructure is suppressed, and thus the two-dimensional carbon nanostructure may be evenly dispersed in the hardmask composition without adding an additive such as a dispersing agent or a surfactant so that the hardmask thus prepared may have excellent etching resistance, and a process for removing unnecessary hardmask patterns after forming a to-be-etched layer pattern may be very easy, where a residue such as a carbon residue may not be produced in the process.

In example embodiments, a two-dimensional carbon nanostructure precursor may have a structure including carbon layers obtained by performing a liquid exfoliating process using a solvent on expanded graphite.

A hardmask may be prepared by coating with the to-be-etched layer with the hardmask composition including at least one of a two-dimensional layered nanostructure and its precursor; the two-dimensional carbon nanostructure precursor; and a solvent, and then oxidizing or reducing the coated resultant.

In example embodiments, before the oxidizing or reducing of the coated resultant, the coated resultant may be heat-treated.

In example embodiments, a heat-treating process may be further performed in addition to the oxidizing or reducing of the coated resultant.

When the two-dimensional carbon nanostructure precursor is a two-dimensional carbon nanostructure containing more than 40 atom % of oxygen, the to-be-etched layer may be coated with the hardmask composition, and then the coated resultant may be reduced to form a hardmask. The two-dimensional carbon nanostructure containing more than 40 atom % of oxygen may contain, for example, about 60 atom % to about 80 atom % of oxygen.

When the two-dimensional carbon nanostructure precursor contains less than 0.01 atom % of oxygen, the to-be-etched layer may be coated with the hardmask composition, and then the coated resultant may be oxidized to prepare a hardmask.

The reducing process may be performed by chemical reduction, heat-treatment reduction, or electrochemical reduction. The chemical reduction is performed by using a reducing agent. Also, the reduction caused by heat-treatment may be performed by heat-treatment at a temperature of about 100° C. to about 1500° C.

Non-limiting examples of the reducing agent may include at least one of hydrazine, sodium borohydride, dimethylhydrazine, sulfuric acid, hydrochloric acid, hydrogen iodide, hydrogen bromide, hydrogen sulfide, hydroquinone, hydrogen, and acetic acid.

The oxidizing process may be performed by using at least one of acid, an oxidizing agent, UV, ozone, Infra Red (IR), heat-treatment, and plasma. Examples of the acid may include sulfuric acid, nitric acid, acetic acid, phosphoric acid, hydrofluoric acid, perchloric acid, trifluoroacetic acid, hydrochloric acid, m-chlorobenzoic acid, and a mixture thereof. Also, examples of the oxidizing agent may include potassium permanganate, potassium perchlorate, ammonium persulfate, and a mixture thereof. According to another example embodiment, a thin-film including at least one of a two-dimensional layered nanostructure and its precursor is provided. The thin-film is, for example, a hardmask.

Hereinafter, in one example embodiment, a method of forming a pattern by using a hardmask composition will be described by referring to FIGS. 1A to 1E.

Referring to FIG. 1A, a to-be-etched layer 11 is formed on a substrate 10. A hardmask composition according to an example embodiment is provided on the to-be-etched layer 11 to form a hardmask 12.

A process of providing the hardmask composition is performed by one of spin coating, air spraying, electrospraying, dip coating, spray coating, doctor blade coating, and bar coating.

In example embodiments, the hardmask composition may be provided by using a spin-on coating method. Here, the hardmask composition may coat the substrate 10 at a thickness of, for example, in a range of about 10 nm to about 10,000 nm, or, about 10 nm to about 1,000 nm, but the thickness of the hard composition is not limited thereto.

A substrate 10 is not particularly limited, and the substrate may be at least one of, for example, a Si substrate; a glass substrate; a GaN substrate; a silica substrate; a substrate including at least one of nickel (Ni), cobalt (Co), iron (Fe), platinum (Pt), palladium (Pd), gold (Au), aluminum (Al), chromium (Cr), copper (Cu), manganese (Mn), molybdenum (Mo), rhodium (Rh), iridium (Ir), tantalum (Ta), titanium (Ti), tungsten (W), uranium (U), vanadium (V), and zirconium (Zr); and a polymer substrate.

A photoresist layer 13 may be formed on the hardmask 12.

As shown in FIG. 1B, a photoresist pattern 13a is formed by exposing and developing the photoresist layer 13 by using a common method in the art.

The process of exposing the photoresist layer 13 may be performed by using, for example, ArF, KrF, or Extreme Ultra-Violet (EUV, typically having photons with energies from 10 eV up to 124 eV). Also, after the exposing process, a heat-treating process at a temperature in a range of about 200° C. to about 500° C. may be performed on the exposed photoresist layer 13.

In the developing process, a developing solution such as an aqueous solution of tetramethylammonium hydroxide (TMAH) may be used.

Thereafter, the hardmask 12 may be etched by using the photoresist pattern 13a as an etching mask to form a hardmask pattern 12a on the to-be-etched layer 11 (FIG. 1C).

A thickness of the hardmask pattern 12a may be in a range of about 10 nm to about 10,000 nm. When the thickness of the hardmask pattern 12a is within this range, the hardmask may have improved etching resistance as well as improved uniformity compared to other thickness ranges.

For example, the etching process may be performed by using a dry etching method using an etching gas. Examples of the etching gas include at least one of $CF_4$, $CHF_3$, $C_2F_6$, $C_2F_4$, $C_3F_8$, $C_4F_8$, $Cl_2$, $BCl_3$, and $O_2$.

The to-be-etched layer 11 may be formed as a plurality of patterns. The plurality of patterns may vary, for example, a metal pattern, a semiconductor pattern, and an insulator pattern. For example, the plurality of patterns may be various patterns applied to a semiconductor integrated circuit device.

The to-be-etched layer 11 may include a material that is to be finally patterned. The material of the to-be-etched layer 11 may include, for example, a metal such as aluminum or copper, a semiconductor such as silicon, or an insulator such as silicon oxide or silicon nitride. The to-be-etched layer 11 may be formed by using various methods such as sputtering, electronic beam deposition, chemical vapor deposition, and physical vapor deposition. For example, the to-be-etched layer 11 may be formed by using a chemical vapor deposition method.

As shown in FIGS. 1D to 1E, the to-be-etched layer 11 may be etched by using the hardmask pattern 12a as an etching mask to later form a to-be-etched layer pattern 11a having a desired fine pattern.

The hardmask according to an example embodiment may be used as a stopper in the manufacture of a semiconductor device by being inserted between other layers.

Hereinafter, in another example embodiment, a method of forming a pattern by using a hardmask composition will be described by referring to FIGS. 2A to 2D.

Figure 2A:
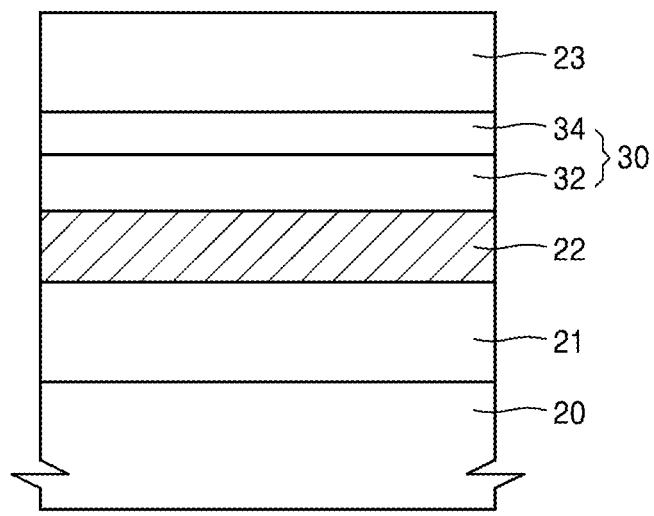
FIGS. 2A to 2D illustrate a method of forming a pattern by using a hardmask composition according to another example embodiment.

Referring to FIG. 2A, a to-be-etched layer 21 is formed on a substrate 20. The substrate 20 may be a silicon substrate.

The to-be-etched layer 21 may include, for example, a silicon oxide layer, a silicon nitride layer, a silicon nitroxide layer, a silicon carbide (SiC) layer, or a derivative layer thereof.

Thereafter, a hardmask composition may be provided on the to-be-etched layer 21 to form a hardmask 22.

Figure 2B:
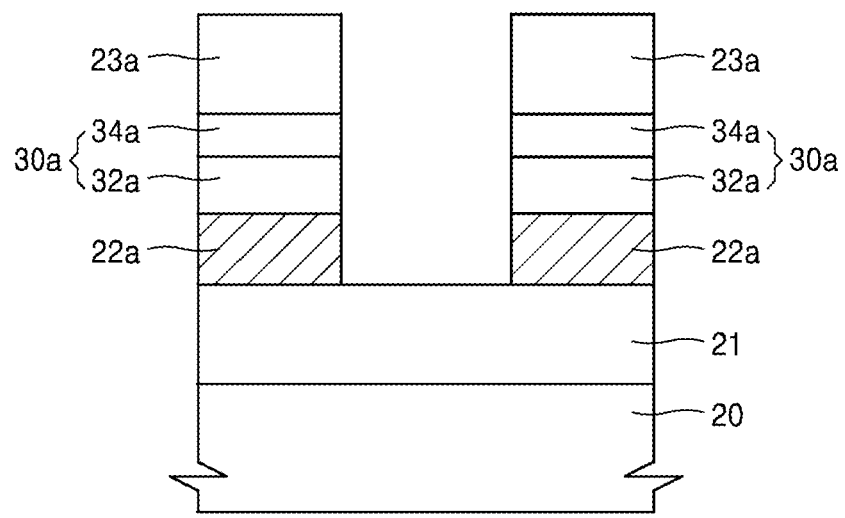
Figure 2C:
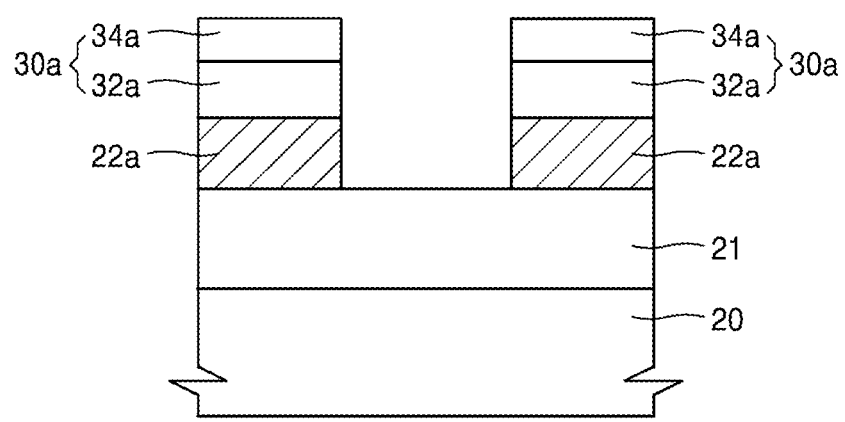

An anti-reflection layer 30 may be formed on the hardmask 22. Here, the anti-reflection layer 30 may include an inorganic anti-reflection layer, an organic anti-reflection layer, or a combination thereof. FIGS. 2A to 2C illustrate cases where the anti-reflection layer 30 includes an inorganic anti-reflection layer 32 and an organic anti-reflection layer 34.

The inorganic anti-reflection layer 32 may include, for example, a SiON layer, and the organic anti-reflection layer 34 may include a polymer layer commonly used in the art having an appropriate refraction index and a high absorption coefficient on a photoresist with respect to a wavelength of light.

A thickness of the anti-reflection layer 30 may be, for example, in a range of about 100 nm to about 500 nm.

A photoresist layer 23 may be formed on the anti-reflection layer 30.

The photoresist layer 23 may be exposed and developed in a common manner to form a photoresist pattern 23a. Then, the anti-reflection layer 30 and the hardmask 22 may be sequentially etched by using the photoresist pattern 23a as an etching mask to form a hardmask pattern 22a on the to-be-etched layer 21. The hardmask pattern 22a includes an inorganic reflection prevention pattern 32a and an organic reflection prevention pattern 34a.

FIG. 2B illustrates the photoresist pattern 23a and a reflection prevention pattern 30a remaining after forming the hardmask pattern 22a. However, in some examples, part of or the whole photoresist pattern 23a and the reflection prevention pattern 30a may be removed during the etching process for forming the hardmask pattern 22a.

FIG. 2C illustrates an example where only the photoresist pattern 23a is removed.

Figure 2D:
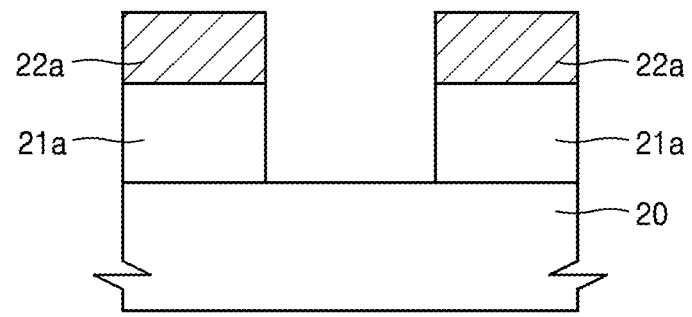

The to-be-etched layer 21 is etched by using the hardmask pattern 22a as an etching mask to form a desired layer pattern, which is a to-be-etched layer pattern 21a (FIG. 2D).

As described above, the hardmask pattern 22a is removed after forming the to-be-etched layer pattern 21. In the preparation of the hardmask pattern according to an example embodiment, the hardmask pattern 22a may be easily removed by using a common method in the art, and almost no residue remains after removing the hardmask pattern 22a.

The removing process of the hardmask pattern 22a may be performed by, but not limited to, $O_2$ ashing and wet stripping. For example, the wet stripping may be performed by using alcohol, acetone, or a mixture of nitric acid and sulfuric acid.

According to an example embodiment, a pattern formed by using a hardmask composition may be used in the manufacture and design of an integrated circuit device according to a preparation process of a semiconductor device. For example, the pattern may be used in the formation of a patterned material layer structure such as metal lining, holes for contact or bias, insulation sections (for example: a Damascene Trench (DT) or shallow trench isolation (STI)), or a trench for a capacitor structure.

Hereinafter, the example embodiments will be described in further detail with reference to the following examples. These examples are for illustrative purposes only and are not intended to limit the scope of the example embodiments.

Preparation Example 1: Preparation of Composition Containing Hexagonal Boron Nitride 500 mg of a bulk hexagonal boron nitride (h-BN) (Industrial Supply, Inc.) was added to 10 ml of N-Methyl-2-pyrrolidone (NMP), and 5 ml of butyl lithium (n-BuLi) was injected thereto in a nitrogen atmosphere. The reaction mixture was stirred at room temperature for 7 days and filtered to obtain an expanded hexagonal boron nitride (h-BN) powder.

The expanded hexagonal boron nitride (h-BN) thus obtained was exfoliated in the manner described as follows to obtain a composition containing a hexagonal boron nitride (h-BN) of a single layer or multi-layers.

200 mg of the expanded hexagonal boron nitride (h-BN) powder was added to 10 ml of NMP, allowed to react by using a sonicator for 10 hours, and centrifuged to obtain a composition containing a hexagonal boron nitride (h-BN) that is exfoliated in a single layer or multi-layers. An amount of the hexagonal boron nitride in the composition was about 2 parts by weight based on 100 parts by weight of the composition.

Preparation Example 2: Preparation of Hexagonal Boron Nitride to which Hydroxyl (—OH) Functional Group is Bonded 100 mg of a bulk hexagonal boron nitride (h-BN) (available from Industrial Supply, Inc.) and 10 ml of a 30 wt % $H_2O_2$ solution were placed in an autoclave, and a temperature of the autoclave was increased to 100° C., and the mixture was allowed to react for about 12 hours or more. When the reaction was completed, the resultant was filtered, and thus an expanded hexagonal boron nitride (h-BN), to which a hydroxyl group (—OH) was bonded, as a powder was obtained from the $H_2O_2$ solution. The powder thus obtained was used to perform the exfoliation process in the same manner as in Preparation Example 1 to obtain a composition containing a hexagonal boron nitride, to which a hydroxyl group (—OH) was bonded, exfoliated in a single layer or multi-layers.

Preparation Example 3: Preparation of Hexagonal Boron Nitride to which Nitro Group ($NO_2$) and —$HSO_3$ Functional Group are Bonded An expanded hexagonal boron nitride (h-BN), to which a nitro group ($NO_2$) and —$HSO_3$ functional group were bonded, as a powder was obtained in the same manner as in Preparation Example 2, except that 10 ml of a mixture of a nitric acid and a sulfuric acid at a weight ratio of 1:3 was used instead of 10 ml of the 30 wt % $H_2O_2$ solution.

The expanded hexagonal boron nitride powder thus obtained was used to perform the exfoliation process in the same manner as in Preparation Example 1 to obtain a composition containing a hexagonal boron nitride, to which a nitro group ($NO_2$) and —$HSO_3$ functional group were bonded, exfoliated in a single layer or multi-layers.

Preparation Example 4: Preparation of Compound Containing Hexagonal Boron Nitride to which —$HSO_3$ Functional Group is Bonded An expanded hexagonal boron nitride (h-BN), to which —$HSO_3$ functional group was bonded, as a powder was obtained in the same manner as in Preparation Example 2, except that 10 ml of oleum was used instead of 10 ml of the 30 wt % H$_2$O$_2$ solution. The expanded hexagonal boron nitride powder, to which —HSO$_3$ functional group was bonded, thus obtained was used to perform the exfoliation process in the same manner as in Preparation Example 2 to obtain a composition containing an expanded hexagonal boron nitride, to which —HSO$_3$ functional group was bonded, exfoliated in a single layer or multi-layers.

Preparation Example 5: Preparation of Compound Containing Hexagonal Boron Nitride to which —NH$_2$ Functional Group is Bonded 100 mg of h-BN and 10 ml of a hydrazine (N$_2$H$_4$) solution was placed in an autoclave, and a temperature of the autoclave was increased to 100° C., and the mixture was allowed to react for about 12 hours or more. When the reaction was completed, the resultant was filtered, and thus an expanded h-BN, to which —NH$_2$ was bonded, as a powder was obtained from the N$_2$H$_4$ solution. The expanded h-BN powder, to which —NH$_2$ functional group was bonded, thus obtained was used to perform the exfoliation process in the same manner as in Preparation Example 1 to obtain a composition containing an expanded h-BN, to which —NH$_2$ functional group was bonded, exfoliated in a single layer or multi-layers.

Preparation Example 6: Preparation of Composition Containing Hexagonal Boron Nitride to which —NH$_2$ Functional Group is Bonded 100 mg of h-BN was loaded in a microwave plasma chamber, 10 sccm of NH$_3$ was flowed thereto, 200 W of power was applied thereto, and then the resultant was treated at room temperature (about 25° C.) for 10 minutes. When the reaction was completed, a h-BN, to which —NH$_2$ was bonded, as a powder was obtained. The h-BN powder, to which —NH$_2$ functional group was bonded, thus obtained was used to perform the exfoliation process in the same manner as in Preparation Example 1 to obtain a composition containing a h-BN, to which —NH$_2$ functional group was bonded, exfoliated in a single layer or multi-layers.

Preparation Example 7: Preparation of Composition Containing Hexagonal Boron Nitride to which —(CH$_2$)$_3$COOH Functional Group is Bonded 100 mg of h-BN was dispersed in tetrahydrofuran (THF) in a flask, 100 ml of glutaric acid acyl peroxide (HOOC—(CH$_2$)$_3$—C=OO—OO=C—(CH$_2$)$_3$—COOH) was injected thereto, and the resultant was heated for 12 hours at a temperature of 80° C. During the reaction, CO$_2$ was removed, and the resultant was filtered to obtain a h-BN, to which —(CH$_2$)$_3$COOH was bonded, as a powder The h-BN powder, to which —(CH$_2$)$_3$COOH was bonded, thus obtained was used to perform the exfoliation process in the same manner as in Preparation Example 1 to obtain a composition containing a h-BN, to which —(CH$_2$)$_3$OOH was bonded, exfoliated in a single layer or multi-layers.

Preparation Example 8: Preparation of Composition Containing Hexagonal Boron Nitride to which —CONH$_2$ Functional Group is Bonded 100 mg of the h-BN having —(CH$_2$)$_3$COOH as prepared in Preparation Example 7 was added to a flask and then dispersed in THF. 1 ml of thionyl chloride (SOCl$_2$) was added thereto at a temperature of 0° C., the temperature was increased to room temperature (about 25° C.), and then the mixture was allowed to react for 2 hours. The resultant was filtered to obtain a h-BN, to which a —COCl functional group was bonded. Then, the h-BN thus obtained was dispersed again in THF, 10 ml of NH$_3$ gas was bubbled in the solution, the mixture was allowed to react at room temperature for 12 hours, and the resultant was filtered to obtain a h-BN, to which —CONH$_2$ was bonded, as a powder. The h-BN powder, to which —CONH$_2$ was bonded, thus obtained was used to perform the exfoliation process in the same manner as in Preparation Example 1 to obtain a composition containing a h-BN, to which —CONH$_2$ was bonded, exfoliated in a single layer or multi-layers.

Preparation Example 9: Preparation of Composition Containing Molybdenum Sulfide 1 g of a bulk molybdenum sulfide powder (Sigma Aldrich) was added to 10 ml of NMP, and then 5 ml of butyllithium (n-BuLi) was injected thereto in a nitrogen atmosphere. The mixture was stirred at room temperature for 7 days, and then the reaction mixture was filtered to obtain a molybdenum sulfide powder. The molybdenum sulfide powder thus obtained was used to perform the exfoliation process in the same manner as in Preparation Example 1 to obtain a composition containing molybdenum sulfide of a single layer or multi-layers.

Preparation Example 10: Preparation of Composition Containing Molybdenum Sulfide to which Hydroxyl Group is Bonded An expanded molybdenum sulfide, to which a hydroxyl group is bonded, as a powder was obtained in the same manner as in Preparation Example 2, except that a pre-treated molybdenum sulfide powder was used instead of the bulk hexagonal boron nitride. The powder of the expanded molybdenum sulfide, to which a hydroxyl group is bonded, thus obtained was used to perform the exfoliation process in the same manner as in Preparation Example 1 to obtain a composition containing the powder of the molybdenum sulfide, to which a hydroxyl group was bonded, of a single layer or multi-layers.

Preparation Example 11: Preparation of Composition Containing Molybdenum Sulfide to which Hydroxyl Group is Bonded 100 mg of (NH$_4$)$_2$MoS$_4$ and 1 ml of mercapto ethanol (HS—C$_2$H$_4$—OH) were dissolved in 10 ml of dimethyl formamide (DMF), and the mixture was placed in an autoclave.

A temperature inside the autoclave was increased to about 200° C., and the mixture was allowed to react for about 12 hours or more. When the reaction was completed, the resultant was filtered, and thus an expanded molybdenum sulfide (MoS$_2$), to which a hydroxyl group (—OH) was bonded, was obtained as a powder. The powder of the expanded molybdenum sulfide, to which a hydroxyl group (—OH) was bonded, thus obtained was used to perform the exfoliation process in the same manner as in Preparation Example 1 to obtain a composition containing the molybdenum sulfide (MoS$_2$), to which a hydroxyl group was bonded, of a single layer or multi-layers.

Preparation Example 12: Preparation of Composition Containing Tungsten Sulfide A composition including tungsten sulfide ($WS_2$) of a single layer or multi-layers was obtained in the same manner as in Preparation Example 9, except that 1 g of a tungsten sulfide powder was used instead of 1 g of the molybdenum sulfide powder.

Preparation Example 13: Preparation of Composition Containing Molybdenum Oxide A composition including molybdenum oxide ($MoO_3$) of a single layer or multi-layers was obtained in the same manner as in Preparation Example 9, except that 1 g of a molybdenum oxide ($MoO_3$) powder was used instead of 1 g of the molybdenum sulfide powder.

Example 1

The composition containing a h-BN of a single layer or multi-layers prepared in Preparation Example 1 was used as a hardmask composition. An amount of the h-BN in the composition was about 2 parts by weight based on 100 parts by weight.

The hardmask composition was heat-treated while spray coating a silicon substrate, on which a silicon oxide layer is formed, to obtain a hardmask containing a h-BN at a thickness of about 200 nm.

The hardmask was coated with an ArF photoresist at a thickness of about 1700 Å and then pre-baked at a temperature of about 110° C. for about 60 seconds. The resultant was then exposed to light by using a light exposing instrument available from ASML (XT: 1400, NA 0.93) and post-baked at a temperature of about 110° C. for about 60 seconds. Next, the photoresist was developed by using an aqueous solution of 2.38 wt % tetramethyl ammonium hydroxide (TMAH) to form a photoresist pattern.

Dry etching was performed using the photoresist pattern, as a mask, and a $CF_4/CHF_3$ mixture gas. The etching conditions included 20 mT of a chamber pressure, 1800 W of a RF power, a 4/10 volume ratio of $C_4F_8/CHF_3$, and an etching time of about 120 seconds.

$O_2$ ashing and wet stripping were performed on a hardmask and an organic material remaining after performing the dry etching to obtain a desired silicon substrate having a silicon oxide layer pattern as a final pattern.

Example 2

A silicon substrate having a silicon oxide pattern was prepared in the same manner as in Example 1, except that the composition containing molybdenum sulfide prepared in Preparation Example 9 was used instead of the composition prepared in Preparation Example 1.

Example 3

A silicon substrate having a silicon oxide pattern was prepared in the same manner as in Example 1, except that the composition containing tungsten sulfide prepared in Preparation Example 12 was used instead of the composition prepared in Preparation Example 1.

Example 4

A silicon substrate having a silicon oxide pattern was prepared in the same manner as in Example 1, except that the composition containing tungsten sulfide prepared in Preparation Example 13 was used instead of the composition prepared in Preparation Example 1.

Comparative Example 1

A silicon substrate having a silicon oxide layer pattern was prepared by using a hardmask including high-temperature amorphous carbon.

A carbon source ($C_3H_6$) was vapor-deposited on the silicon oxide layer formed on the silicon substrate to form a hardmask including high-temperature amorphous carbon.

The vapor deposition was performed by using a chemical vapor deposition method under conditions including a temperature of about 550° C., a pressure in a range of about 0.51 mTorr, and an ion energy in a range of about 150 eV.

The hardmask was coated with an ArF photoresist at a thickness of about 1700 Å and then pre-baked at a temperature of about 110° C. for about 60 seconds. The resultant was then exposed to light by using a light exposing instrument available from ASML (XT: 1400, NA 0.93) and post-baked at a temperature of about 110° C. for about 60 seconds. Next, the photoresist was developed by using an aqueous solution of 2.38 wt % Tetramethylammonium Hydroxide (TMAH) to form a photoresist pattern.

Dry etching was performed using the photoresist pattern, as a mask, and a $CF_4/CHF_3$ mixture gas. The etching conditions included 20 mT of a chamber pressure, 1800 W of a RF power, a 4/10 volume ratio of $C_4F_8/CHF_3$, and an etching time of about 120 seconds.

$O_2$ ashing and wet stripping were performed on the hardmask and an organic material remaining after performing the dry etching to obtain a desired silicon substrate having a silicon oxide layer pattern as a final pattern.

Evaluation Example 1: X-ray diffraction (XRD) analysis measurement:

XRD analysis was performed on the functionalized hexagonal boron nitride prepared in Preparation Examples 2 to 5. For the XRD analysis, a 12 KW XRD diffractometer was used, and the analysis conditions included measurement at a rate of about 4° per minute within a range of about 5° to about 80° as a diffraction angle 2θ.

Figure 3:
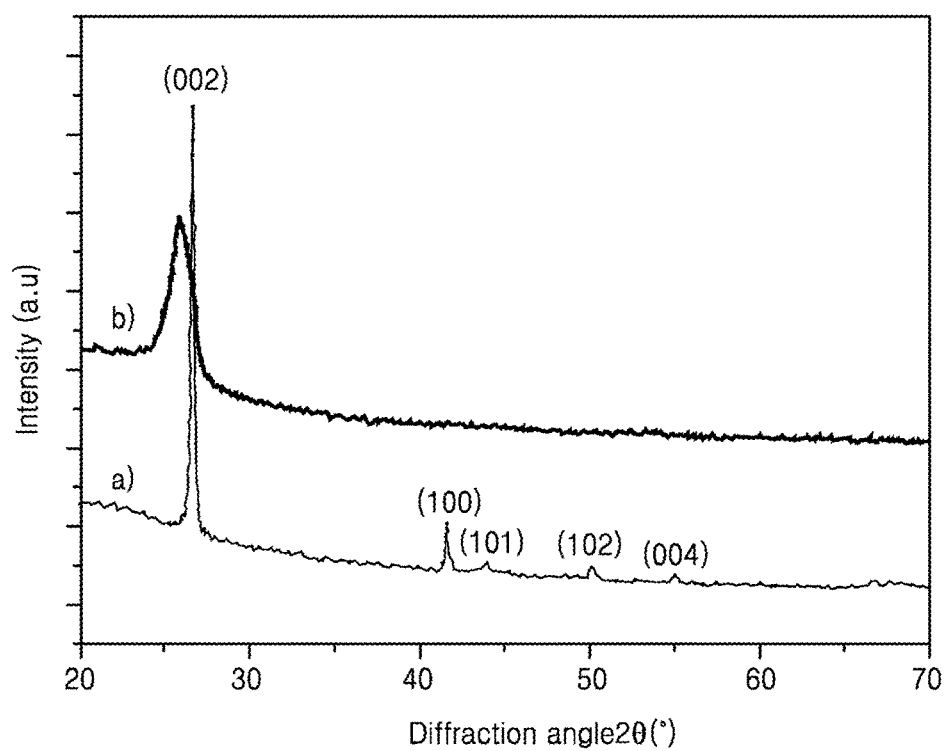
FIG. 3 is a graph illustrating X-ray diffraction analysis results of functionalized hexagonal boron nitrides prepared in Preparation Example 2, Preparation Example 3, Preparation Example 4, and Preparation Example 5.

The analysis results are shown in FIG. 3. In FIG. 3, a) is related to a bulk hexagonal boron nitride, which is a starting material, and b) is related to a boron nitride to which a OH functional group is bonded as prepared in Preparation Example 2.

Referring to FIG. 3, the boron nitride to which a OH functional group is bonded as prepared in Preparation Example 2 had a peak of (002) crystal face which appeared broad and weak compared to that of the bulk hexagonal boron nitride (a parent h-BN), which was a starting material. Also, peaks of (100), (101), and (102) crystal face were observed within a range where 2θ is from about 40° to about 50°. In this regard, it may be known that structure ordering of the hexagonal boron nitride was reduced. Also, the functionalized hexagonal boron nitrides prepared in Preparation Examples 3 to 5 had the same XRD analysis pattern with that of the functionalized hexagonal boron nitride shown in b) of FIG. 3.

From the XRD analysis results of the functionalized hexagonal boron nitrides prepared in Preparation Examples 2 to 5, 2θs of a (002) face, an interlayer distance (d-spacings: $d_{002}$), and average particle diameters (La) of crystals were obtained, and the results are shown in Table 1.

The interlayer distance was calculated by using Bragg's law defined in Equation 1 below, and the average particle diameters (La) of the crystals were calculated by using the Scherrer equation defined in Equation 2.

$$d_{002} = \lambda/2 \sin \theta \quad \text{[Equation 1]}$$

$$La = (0.9\lambda)/(\beta \cos \theta) \quad \text{[Equation 2]}$$

In Equations 1 and 2, λ is an X-ray wavelength (1.54 Å) and β is a full width at half maximum (FWHM) at a Bragg's angle.

TABLE 1

|  | 2θ (°) | Interlayer distance ($d_{002}$) (nm) | Average particle diameter (La) of crystals (nm) |
| --- | --- | --- | --- |
| Preparation Example 2 | 26.4 | 0.337 | 5.6 |
| Parent h-BN | 26.8 | 0.332 | 23.8 |
| Preparation Example 3 | 26.0 | 0.342 | 6.4 |
| Preparation Example 4 | 25.7 | 0.346 | 6.6 |
| Preparation Example 5 | 26.5 | 0.336 | 8.2 |

Referring to Table 1, the functionalized hexagonal boron nitrides prepared in Preparation Examples 2 to 5 have the same structure as the parent h-BN since 2θ with respect to a (002) face of the functionalized hexagonal boron nitrides prepared in Preparation Examples 2 to 5 is similar to or the same as 2θ with respect to a (002) face of the parent h-BN, which is a starting material.

Evaluation Example 2: Raman Spectrum Analysis

Figure 4A:
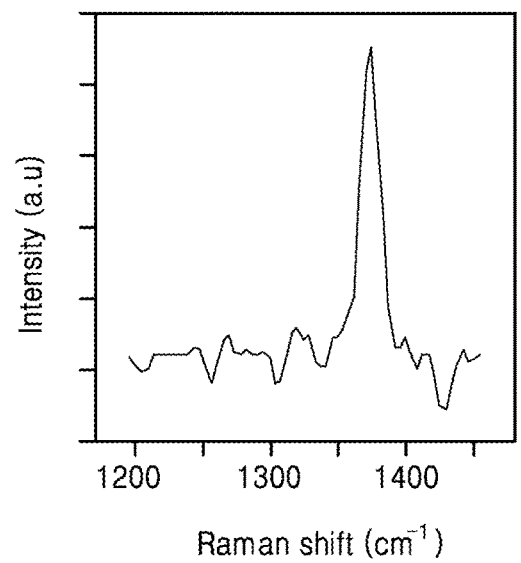
FIGS. 4A to 4C are graphs each respectively illustrating a Raman spectrum of a hexagonal boron nitride used in Example 1, Raman spectrums of a molybdenum sulfide used in Example 2, and a tungsten sulfide used in Example 3.
Figure 4B:
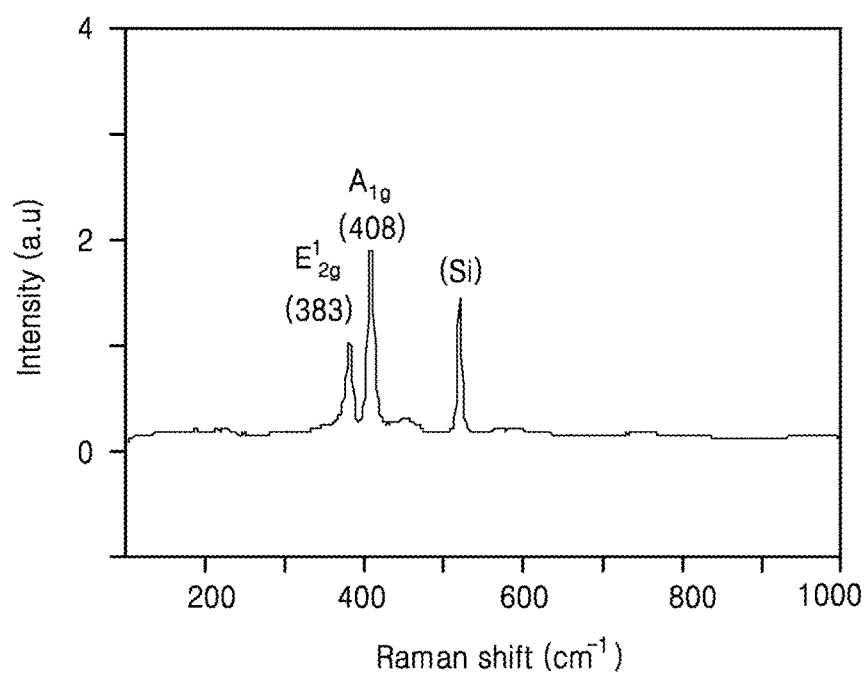
Figure 4C:
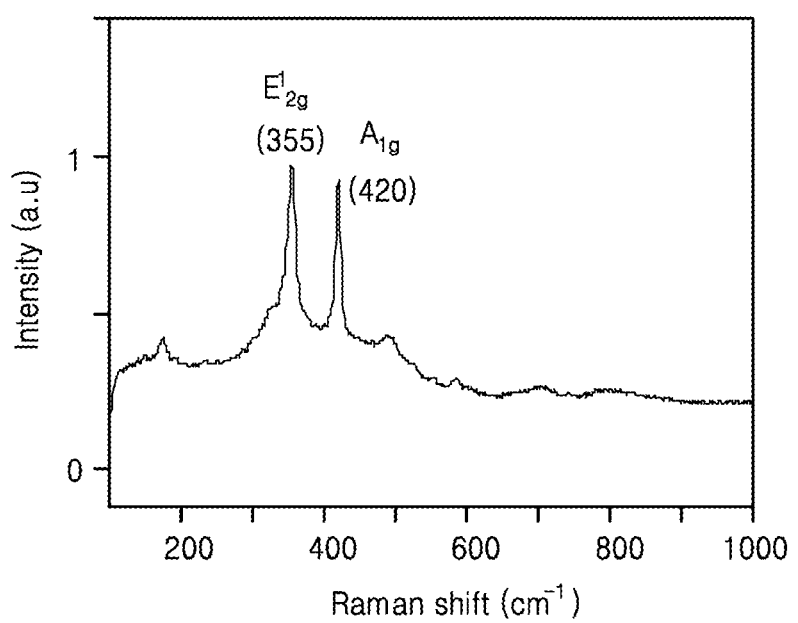

Raman spectroscopy analysis was performed on the hexagonal boron nitride prepared in Example 1, the molybdenum sulfide prepared in Example 2, and the tungsten sulfide prepared in Example 3. The Raman spectroscopy analysis results are shown in FIGS. 4A to 4C. The Raman spectroscopy analysis was performed by using the Raman instrument, RM-1000 Invia (514 nm, Ar$^+$ ion laser. Here, a peak at about 1360 cm$^{-1}$ was observed.

From the analysis results, compositions of the hexagonal boron nitride, the molybdenum sulfide, and the tungsten sulfide were confirmed.

Evaluation Example 3: Etching Resistance

Etching resistance was evaluated by calculating an etching selection ratio by measuring the thickness differences of the hardmask and the silicon oxide layer before and after performing the dry etching by using each of the hardmasks prepared in Examples 1 to 4 and Comparative Example 1.

In Table 2, the etching selectivity shows a ratio of the thickness difference of the hardmask before and after the etching to the thickness difference of the silicon oxide layer before and after the etching.

TABLE 2

|  | Etching selectivity |
| --- | --- |
| Example 1 | 5.6 |
| Example 2 | 6.5 |
| Example 3 | 6.1 |
| Example 4 | 7.8 |
| Comparative Example 1 | 10.0 |

As shown in Table 2, the etching selectivity of the hardmasks prepared in Examples 1 to 4 is compared to the etching selectivity of the hardmask prepared in Comparative Example 1. Thus, it may be confirmed that the etching resistances of the hardmasks prepared in Examples 1 to 4 were better than the etching resistance of the hardmask prepared in Comparative Example 1. Also, the etching selection ratios of the hardmasks prepared in Examples 4 to 7 were at the same level as the etching selection ratios of the hardmasks prepared in Examples 1 to 4.

Evaluation Example 4: Pattern Shape Analysis

Etching was performed by using each of the hardmasks prepared in Examples 1 to 4 and Comparative Examples 1 to 3, and then a cross-section of the silicon substrate having a silicon oxide layer pattern was observed by using FE-SEM, and the results are shown in Table 3.

TABLE 3

|  | Shape of pattern after hardmask etching | Shape of pattern after silicon oxide etching |
| --- | --- | --- |
| Example 1 | Vertical | Vertical |
| Example 2 | Vertical | Vertical |
| Example 3 | Vertical | Vertical |
| Example 4 | Vertical | Vertical |
| Comparative Example 1 | Arched | Tapered |
| Comparative Example 2 | Arched | Tapered |
| Comparative Example 3 | Arched | Tapered |

As shown in Table 5, the silicon oxide layer pattern shapes having each of the hardmasks prepared in Examples 1 to 4 are vertical, unlike the pattern shapes of the hardmask prepared in Comparative Example 1.

As described above, a hardmask composition according to the one or more of the above example embodiments has improved etching resistance and mechanical strength and is transparent, and thus when a hardmask includes the hardmask composition, the hardmask may be easily aligned and may be easily removed after an etching process. When the hardmask is used, efficiency of a semiconductor process may improve compared to when the hardmask is not used.

It should be understood that the example embodiments described therein should be considered in a descriptive sense only and not for purposes of limitation. Descriptions of features within each embodiment should typically be considered as available for other similar or same features in other embodiments.

While one or more example embodiments have been described with reference to the figures, it will be understood by those of ordinary skill in the art that various changes in form and details may be made therein without departing from the spirit and scope of the example embodiments as defined by the following claims.

What is claimed is:

1. A method of forming a pattern, the method comprising:
   forming a to-be-etched layer on a substrate;
   forming a hardmask composition on the to-be-etched layer, the hardmask composition including at least one of a two-dimensional layered nanostructure and a precursor thereof and a solvent, wherein an amount of the at least one of the two-dimensional layered nanostructure and the precursor thereof is about 0.01 part to about 40 parts by weight based on 100 parts by weight of the hardmask composition;

forming a photoresist layer on the hardmask composition;
forming a hardmask pattern having a two-dimensional layered nanostructure on the to-be-etched layer by etching the two-dimensional layered nanostructure using the photoresist layer as an etching mask; and
etching the to-be-etched layer by using the hardmask pattern as an etching mask; wherein:
the two-dimensional layered nanostructure is at least one of a hexagonal boron nitride derivative, a metal chalcogenide-based material, and a metal oxide,
the hexagonal boron nitride derivative including at least one of a hexagonal boron nitride (h-BN) and a hexagonal boron carbonitride (h-BxCyNz), where x+y+z=3,
the metal chalcogenide-based material including one metal element from tungsten sulfide ($WS_2$) and molybdenum sulfide ($MoS_2$), and
the metal oxide including at least one of $MoO_3$, $WO_3$, and $V_2O_5$.

2. The method of claim 1, wherein forming the hardmask comprises coating a top of the to-be-etched layer with the hardmask composition.

3. The method of claim 2, wherein heat-treating is performed during or after the coating of the to-be-etched layer with the hardmask composition.

4. The method of claim 1, wherein forming the hardmask comprises depositing a precursor of the two-dimensional layered nanostructure.

5. The method of claim 1, wherein a thickness of the hardmask is in a range of about 10 nm to about 10,000 nm.

6. The method of claim 1, wherein forming the hardmask comprises one of spin coating, air spraying, electrospraying, dip coating, spray coating, doctor blade coating, and bar coating.

7. The method of claim 1, wherein the forming the photoresist layer comprises forming the photoresist layer directly on the hardmask composition.

8. The method of claim 1, wherein:
a thickness of the two-dimensional layered nanostructure is in a range of about 0.34 nm to about 100 nm, and
the two-dimensional layered nanostructure includes one layer to three hundred layers.

* * * * *